US007968458B2

United States Patent
Chuman et al.

(10) Patent No.: US 7,968,458 B2
(45) Date of Patent: Jun. 28, 2011

(54) ELECTRONIC CIRCUIT BOARD AND ITS MANUFACTURING METHOD

(75) Inventors: Takashi Chuman, Tsurugashima (JP); Satoru Ohta, Tsurugashima (JP); Satoshi Miyaguchi, Tsurugashima (JP)

(73) Assignee: Pioneer Corporation, Tokyo (JP)

( * ) Notice: Subject to any disclaimer, the term of this patent is extended or adjusted under 35 U.S.C. 154(b) by 881 days.

(21) Appl. No.: 11/666,137

(22) PCT Filed: Oct. 21, 2005

(86) PCT No.: PCT/JP2005/019845
§ 371 (c)(1),
(2), (4) Date: Nov. 28, 2007

(87) PCT Pub. No.: WO2006/046676
PCT Pub. Date: May 4, 2006

(65) Prior Publication Data
US 2008/0124522 A1     May 29, 2008

(30) Foreign Application Priority Data
Oct. 25, 2004 (JP) ................................. 2004-309355

(51) Int. Cl.
*H01L 21/44*     (2006.01)
(52) U.S. Cl. ........ 438/658; 438/597; 438/598; 438/599; 438/669; 438/685; 438/778; 438/785
(58) Field of Classification Search .......... 438/597–599, 438/658, 669, 685, 778, 785
See application file for complete search history.

(56) References Cited

U.S. PATENT DOCUMENTS

| 3,634,203 | A | * | 1/1972 | McMahon et al. | 205/124 |
| 4,035,206 | A | * | 7/1977 | Rioult et al. | 438/656 |
| 4,098,637 | A | * | 7/1978 | Bell | 438/635 |
| 4,742,025 | A | * | 5/1988 | Ohyu et al. | 438/694 |
| 2002/0084456 | A1 | * | 7/2002 | Sugihara et al. | 257/48 |
| 2005/0013088 | A1 | * | 1/2005 | Horikawa et al. | 361/303 |

FOREIGN PATENT DOCUMENTS

| JP | 61-100971 | 5/1986 |
| JP | 64-086113 | 3/1989 |
| JP | 02-116831 | 5/1990 |
| JP | 04-043328 | 2/1992 |
| JP | 05-343688 | 12/1993 |
| JP | 09-82977 | 3/1997 |
| JP | 2003-255857 | 9/2003 |

* cited by examiner

*Primary Examiner* — Kevin M Picardat
*Assistant Examiner* — Bac H Au
(74) *Attorney, Agent, or Firm* — Drinker Biddle & Reath LLP

(57) ABSTRACT

A production process for making an electronic circuit substrate comprising: a patterning step of forming a respectively anodically oxidizable conductor pattern and distribution pattern connected to the conductor pattern on a substrate; and an anodic oxidation step of generating an oxide film from the conductor pattern and the distribution pattern by contacting an electrolyte solution with the conductor pattern and the distribution pattern and carrying out anodic oxidation while applying current thereto, the patterns serving as anodes, wherein the width or film thickness of the distribution pattern is at least partially set so that an insulator portion is formed in the anodic oxidation step in which an oxide film formed on one of the side walls of the distribution pattern is integrated with an oxide film formed on the other side wall.

19 Claims, 13 Drawing Sheets

FIG. 8
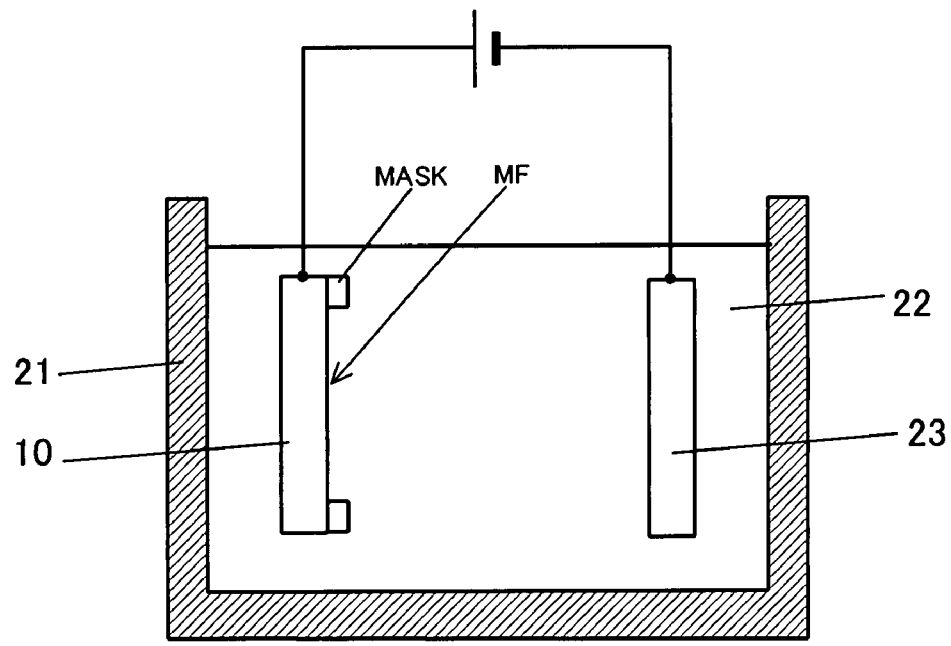
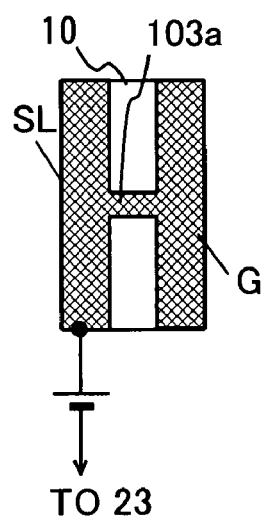
FIG. 9A
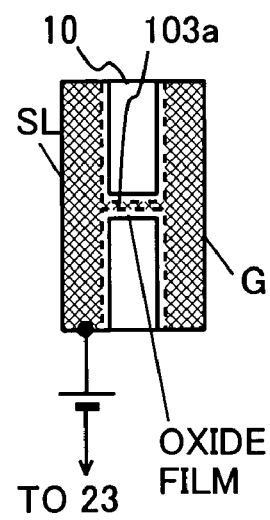
FIG. 9B
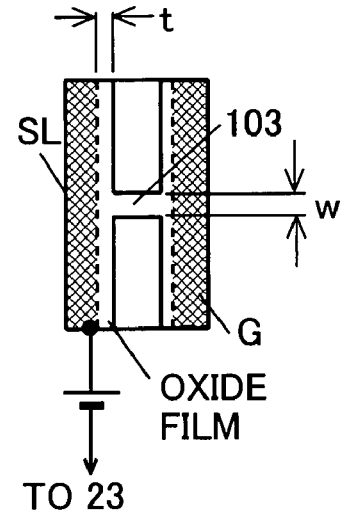
FIG. 9C

ELECTRONIC CIRCUIT BOARD AND ITS MANUFACTURING METHOD

BACKGROUND OF THE INVENTION

1. Technical Field

The present invention relates to an electronic circuit substrate that can be used in a display panel or the like, and a production process thereof.

2. Background Art

Electroluminescence (EL) display apparatuses equipped with display panels composed of light-emitting devices utilizing the EL generated by a magnetic field as a result of the generation or transport of a charge in a substance, the guiding of light or the recombination of a charge, such as an organic EL device using an organic compound material, have recently attracted considerable attention. Organic EL devices consist of red EL devices having a structure that emits red light, green EL devices having a structure that emits green light, and blue EL devices having a structure that emits blue light. Color display apparatuses can be realized by combining these three red (R), green (G) and blue (B) organic EL devices into a single pixel emission unit, and arranging a plurality of these pixels on a panel in the form of a matrix. Known methods for driving display panels employing a color display apparatus consist of simple matrix driving and active matrix driving. Since EL display apparatuses of the active matrix driving type offer the advantages of lower power consumption and reduced crosstalk between pixels as compared with those of the simple matrix driving type, they are suitable for large-screen display apparatuses and high-definition display apparatuses in particular.

Anode power supply lines, cathode power supply lines, scan lines responsible for horizontal scanning and data lines arranged intersecting each scan line are formed in the form of a matrix in the display panels, namely the electronic circuit substrates, of active matrix driving types of EL display apparatuses. An RGB subpixel is formed at each RGB intersection of the scan lines and data lines.

Scan lines are connected to the gate of a field effect transistor (FET) for selecting scan lines for each subpixel, data lines are connected to the source thereof, and the gate of an FET for driving light emission is connected to the drain thereof. A drive voltage is applied to the source of the light emission driving FET via the anode power supply lines, and the anode terminal of the EL device is connected to the drain D thereof. A capacitor is connected between the gate and source of the light emission driving FET. Moreover, a ground potential is applied to the cathode terminal of the EL device via the cathode power supply lines.

In this manner, in order to actively drive an organic EL device, two or more thin film transistors (TFT) such as FETs are required for each subpixel of an electronic circuit substrate, and an organic EL device and a plurality of TFT devices are arranged within a single subpixel.

The TFT device may be an inorganic TFT device formed with an inorganic material such as polysilicon, or an organic TFT device formed with an organic material containing an organic semiconductor. In the case of an organic TFT device, various techniques have been proposed for the gate insulating film, such as a method in which an inorganic insulating film such as $SiO_2$ is formed by vacuum deposition, and a method in which a organic insulating film such as polyaniline is formed by spin coating or printing.

There is also a method for forming a gate insulating film by anodic oxidation of the gate electrode for either type of TFT device (see Japanese Patent Application Laid-open No. 2004-235298). In the case of attempting to form an insulating film (such as a gate insulating film) on a metal pattern of an electrode or wiring within a display panel using this anodic oxidation method, since the portions where the insulating film is desired to be provided become completely electrically connected, it is necessary to carry out anodic oxidation by providing distribution patterns and applying a voltage from the outside to all patterns.

However, it is also necessary to cut away those distribution patterns that are no longer required at those portions covered by the formed insulating film.

Although examples of techniques for cutting away the distribution patterns following anodic oxidation include etching and laser irradiation and heating (see Japanese Patent Application Laid-open No. H5-343688), the production process is cumbersome and complex for each of these techniques.

DISCLOSURE OF THE INVENTION

Therefore, one example of the present invention provides an electronic circuit substrate capable of simplifying the production process and a process for producing that electronic circuit substrate process for making an electronic According to the present invention there is obtained a production process for making an electronic circuit substrate comprising: a pattering step of forming a respectively anodically oxidizable conductor pattern and distribution pattern connected to the conductor pattern on a substrate; and an anodic oxidation step of generating an oxide film from the conductor pattern and the distribution pattern by contacting an electrolyte solution with the conductor pattern and the distribution pattern and carrying out anodic oxidation while applying current thereto, the patterns serving as anodes, wherein an insulator portion is formed, in the anodic oxidation step, for interrupting a conduction path of the distribution pattern by oxidizing the distribution pattern.

According to the present invention there is also obtained an electronic circuit substrate comprising: an anodically oxidizable conductor pattern formed on a substrate; an oxide film arranged on the conductor pattern generated from the conductor pattern by anodic oxidation; and an insulator portion formed between the side walls of the conductor pattern.

BRIEF DESCRIPTION OF THE DRAWINGS

FIG. 8 is a schematic cross-sectional view showing an electrolytic bath for carrying out anodic oxidation treatment in an organic EL display panel production process of an embodiment according to the present invention.

FIGS. 9A to 9C are partial overhead view each showing a conductor and distribution pattern on a substrate during anodic oxidation treatment in an organic EL display panel production process of an embodiment according to the present invention respectively.

DETAILED DESCRIPTION OF THE INVENTION

The following provides an explanation of an organic EL display panel and a production process thereof as an example of an electronic circuit substrate of an embodiment of the present invention with reference to the drawings.

Figure 1:
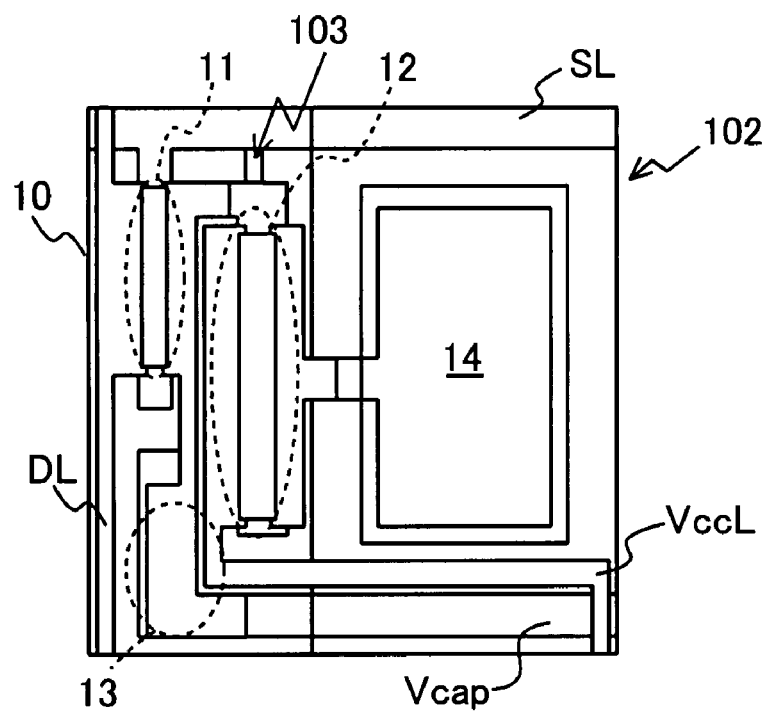
FIG. 1 is a partial overhead view showing a subpixel emission portion of an organic EL display panel of an embodiment according to the present invention.
Figure 2:
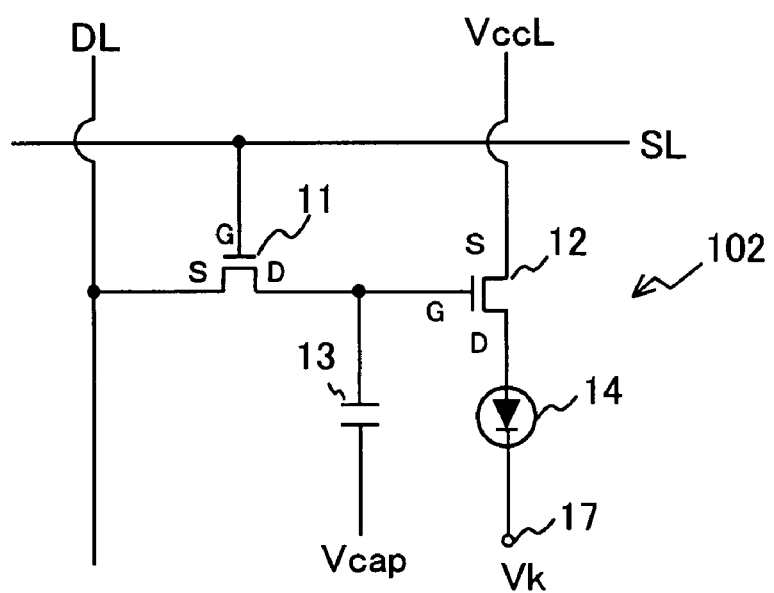
FIG. 2 is a equivalent circuit diagram showing a subpixel emission portion of an organic EL display panel of an embodiment according to the present invention.

FIG. 1 is a partial overhead view showing a subpixel emission portion of an organic EL display panel, while FIG. 2 is an equivalent circuit drawing thereof.

An emission portion 102 formed on a substrate 10 is composed of a switching organic TFT device 11 of a switching transistor, a driving organic TFT device 12 of a driving transistor, a capacitor 13 for holding a data voltage, and an organic EL device 14. A pixel emission portion can be realized by arranging this constitution in the vicinity of each intersection of a scan line SL, a power supply line VccL and a data line DL. Although the drawings show the case of the simplest constitution consisting of two transistors for driving an organic EL device, this can also be applied to devices using three or more transistors.

A gate electrode G of the switching organic TFT device 11 is connected to a scan line SL to which is supplied an address signal, while a source electrode S of the switching organic TFT device 11 is connected to a data line DL to which is supplied a data signal. A drain electrode D of the switching organic TFT device 11 is connected to a gate electrode G of the driving organic TFT device 12 and one of the terminals of the capacitor 13. A source electrode S of the driving organic TFT device 12 is connected to a power supply line VccL, and the other terminal of the capacitor 13 is connected to a capacitor line Vcap. A drain electrode D of the driving organic TFT device 12 is connected to the anode of the organic EL device 14, while the cathode of the organic EL device 14 is connected to a common electrode 17. The power supply line VccL and common electrode 17 are respectively connected to voltage sources (not shown) respectively supplying electrical power thereto.

The lower patterns (consisting of the scan line SL, gate electrode G of the switching organic TFT device 11, gate electrode G of the driving organic TFT device 12 and the other terminal of the capacitor 13) on the substrate 10 of the organic EL display panel are anodically oxidizable conductor patterns. Oxide films formed from these conductor patterns by anodic oxidation serve as insulating films on each conductor pattern.

What should be noted here is an insulating portion formed between the scan line SL and a side wall of the gate electrode G of the driving organic TFT device 12. This insulator portion 103 electrically insulates the scan line SL and the gate electrode G of the driving organic TFT device 12.

The insulator portion 103 is composed only of an oxide film obtained by anodic oxidation, and is made from the same material as the insulating film on the conductor patterns. Although the insulating portion is uniformly formed to have a constant width in the drawings, the width may also be set to vary.

In the present embodiment, as a result of providing the insulator portion 103 by anodic oxidation, the effect is demonstrated by which the step of cutting the distribution patterns following anodic oxidation of the gate insulating films of the organic TFT devices and so on can be omitted from the production process.

Figure 3:
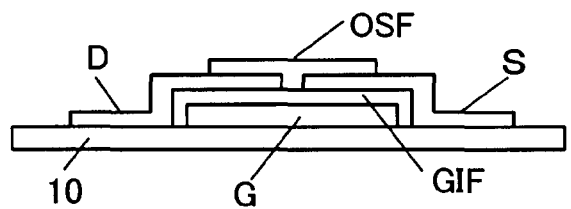
FIG. 3 is a partial cross-sectional view of an organic TFT device in a subpixel emission portion of an organic EL display panel of an embodiment according to the present invention.

FIG. 3 shows an example of the structure of the switching organic TFT device 11 and the driving organic TFT device 12. The organic TFT devices are composed of opposing source S and drain D electrodes, an organic semiconductor film OSF composed of an organic semiconductor laminated so as to form a channel between the source electrode and the drain electrode, and a gate electrode G that applies an electric field to the organic semiconductor film OSF between the source electrode S and the drain electrode D. Moreover, the organic TFT devices have a gate insulating film GIF that covers the gate electrode G and insulates it from the source electrode S and the drain electrode D.

Figure 4:
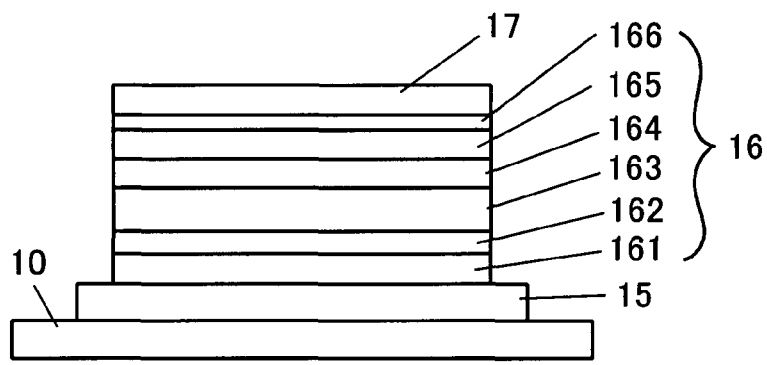
FIG. 4 is a partial cross-sectional view of an organic EL device in a subpixel emission portion of an organic EL display panel of an embodiment according to the present invention.

FIG. 4 shows an example of the structure of the organic EL device 14. The organic EL device 14 is composed of a pixel electrode 15, an organic material layer 16 and a common electrode 17. Although the organic material layer 16 is normally composed of a plurality of layers such as a hole injection layer 161, hole transport layer 162, emission layer 163, hole blocking layer 164, electron transport layer 165 and electron injection layer 166 sequentially laminated on the pixel electrode 15, it is minimally required to contain at least an emission layer. The organic material layer 16 is coated for each pixel according to the emission color thereof. Although the explanation here is provided based on using the pixel electrode 15 as a transparent anode, at least the pixel electrode 15 or the common electrode 17 is composed of a light-transmitting conducting material for extracting EL emissions to the outside.

Figure 5:
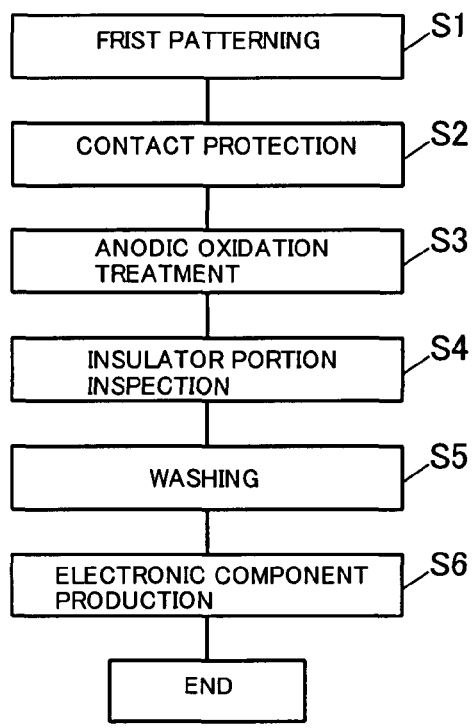
FIG. 5 is a flow chart for explaining an organic EL display panel production process of an embodiment according to the present invention.

FIG. 5 shows a general outline of the procedure for an organic EL display panel production process. A first patterning step S1 for depositing metal film patterns (all electrically connected) for wires and electrodes on a substrate by a deposition method such as vapor deposition or sputtering, a contact protection step S2 for depositing protective layers at sites such as the contact portions of the metal film patterns where an insulating film is not required, an anodic oxidation step S3 for immersing a substrate, provided with metal film patterns in which portions requiring an insulating film are exposed, in a predetermined electrolyte solution, and carrying out anodic oxidation treatment by applying a current from a power supply between a counter electrode (cathode) and the metal film (anode), an inspection step S4 for inspecting the insulating portions between the patterns following formation thereof, a washing step S5 for washing the substrate having the metal film coated with an oxide by anodic oxidation, and a step S6 for producing a plurality of electronic components such as organic EL devices or TFT on the substrate, are carried out sequentially. When forming a multilayer wiring structure, the contact protection step S2, the anodic oxidation step S3, the inspection step S4, and the washing step S5 are repeatedly carried out. Furthermore, following production of the organic EL devices, a sealing step is carried out in which a sealing film is formed that covers the circuits and organic EL devices on the substrate with silicon nitride or silicon oxide-nitride, or the circuits and organic EL devices are sealed in a package containing a desiccant.

The following provides a detailed explanation of the organic EL display panel production method.

[Formation of Lower Conductor Pattern]

Figure 6:
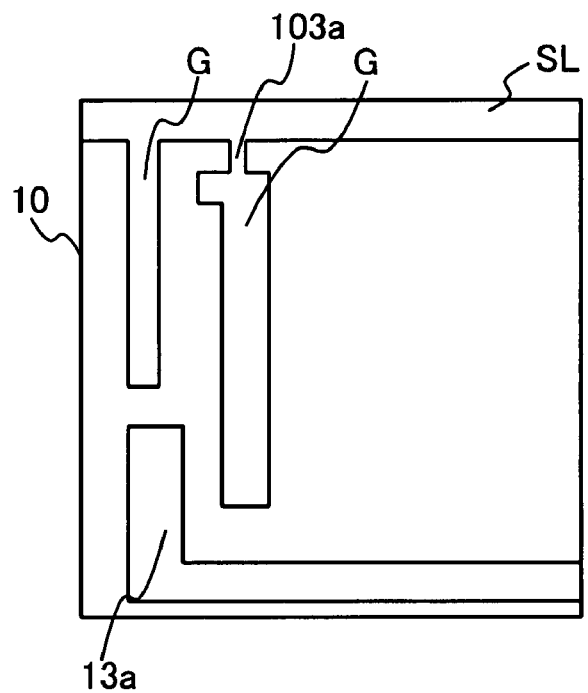
FIGS. 6 and 7 are partial overhead views each showing a substrate in an organic EL display panel production process of an embodiment according to the present invention respectively.

As shown in the overhead view of FIG. 6, a lower conductor pattern is first formed on a glass or other substrate 10 containing a scan line SL, gate electrodes G, and one electrode 13a of a capacitor. Simultaneously, a distribution pattern 103a made of the same material as the gate electrodes G and scan line SL is formed that connects the gate electrodes G and the scan line SL so as to enable anodic oxidation. The gate electrodes G belong to switching and driving organic TFT devices.

The material of the gate electrodes in this conductor pattern may be any material provided it is a metal such as Ta that can be anodically oxidized, examples of which include metals such as Al, Mg, Ti, Nb and Zr, and alloys or laminates thereof. Tantalum pentoxide ($Ta_2O_5$), which is obtained by anodic oxidation of a tantalum (Ta) electrode, has a high dielectric constant of about 24, and is extremely advantageous in terms of current flow by the organic TFT device. In addition, the conductor pattern may be provided in a single layer, or may be provided in the form of multilayer wiring consisting of two or more layers laminated with a second conductor pattern.

Furthermore, sputtering using a mask, EB vapor deposition, resistance heating vapor deposition, CVD or printing can be used for pattern deposition of all of the following thin films corresponding to the use of an organic material or inorganic material. The lower conductor pattern can be patterned by dry etching or wet etching.

The substrate may be a glass substrate, PES, PS or other type of plastic substrate, or laminated substrate consisting of glass and plastic, and an alkaline barrier film or gas barrier film may be coated on the substrate surface. Examples of plastic substrates include films made of polyethylene terephthalate, polyethylene-2,6-naphthalate, polycarbonate, polysulfone, polyether sulfone, polyether ether ketone, polyphenoxy ether, polyallylate, fluororesin and polypropylene.

[Formation of Contact Protective Pattern]

Figure 7:
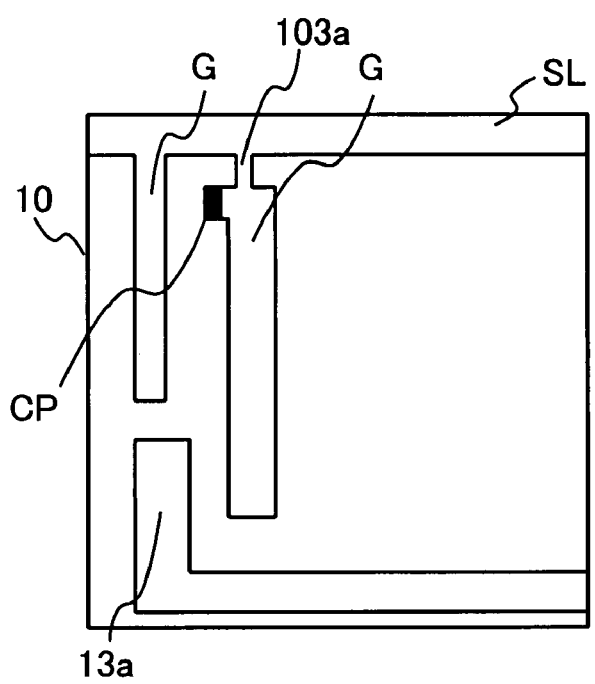

As shown in FIG. 7, an insulating contact protective portion CP able with withstand anodic oxidation is respectively provided for forming contact portions that connect the drain electrode D of the switching organic TFT device 11 and the gate electrode G of the driving organic TFT device in a later step. Metal compounds such as metal oxides, metal nitrides or metal fluorides, examples of which include $Al_2O_3$, $SiO_2$, SiN and SiON, or insulating polymers such as polyimide, can be used for the material of the protective portions.

Moreover, portions on the substrate 10 not to be subjected to anodic oxidation treatment, such as each terminal of electrodes other than the contact portions, are protected by depositing an insulating mask thereon.

[Formation of Oxide Insulating Film]

Oxide films are formed from anodically oxidizable conductor patterns and distribution patterns on the substrate formed in the pattern step by contacting an electrolyte solution with the conductor patterns and distribution patterns and carrying out anodic oxidation by applying current using these as anodes (anodic oxidation step). Namely, gate insulating films of each TFT device and other insulating films are formed from the lower conductor patterns by anodic oxidation. Here, a dielectric layer of the capacitor 13 is simultaneously deposited from the electrode 13a using the same dielectric material as the gate insulating films.

FIG. 8 is a schematic cross-sectional view showing an electrolytic bath for carrying out anodic oxidation treatment. In order to grow an insulating film, the substrate 10 is immersed in an electrolyte solution 22 in an electrolytic bath 21 with the conductor and distribution patterns MF facing a counter electrode 23, and anodic oxidation is carried on the conductor and distribution patterns MF by applying a positive voltage to the conductor and distribution patterns MF with respect to the counter electrode 23. A solution containing ammonium borate or ammonium phosphate, for example, can be used for the electrolyte solution.

FIG. 9 are enlarged, partial overhead views showing conductor and distribution patterns (scan line SL, gate electrode G and distribution pattern 103a) on the substrate 10 during anodic oxidation treatment. The surface of the conductor and distribution patterns MF on the substrate 10 are transformed to oxide films by anodic oxidation, and a laminated structure is formed composed of lower conductor and distribution patterns MF and upper oxide films.

As shown in FIG. 9, the distribution patterns 103a that connect the gate electrode G and the scan line SL are all oxidized resulting in the formation of insulator portion 103. Here, as shown in FIG. 9A, although all the distribution patterns 103a are made of metal, the width of the distribution patterns 103a becomes narrower over time since the width of the metal portions of the distribution patterns 103a become narrower due to the oxide films formed on the side walls becoming thicker (FIG. 9B). As shown in FIG. 9C, after a predetermined amount of time of the anodic oxidation step has elapsed, an oxide film formed on one of the side walls of the distribution pattern integrates with the oxide film formed on the other side wall, resulting in the formation of an insulator portion only. In this manner, the insulator portion 103 is formed that interrupts the conduction path by oxidizing the distribution patterns. The width of the distribution pattern 103a is set so that only an insulator portion is formed. For example, as shown in FIG. 9C, the line width w of the distribution pattern 103 extending across the gate electrode G of the driving TFT device is set in advance so as to be roughly no more than twice the film thickness t of an oxide film such as the gate insulating film.

Electronic components are then formed on the substrate in a subsequent step by inspecting for the presence or absence of the insulator portion 103 formed from anodically oxidized distribution patterns connected to conductor patterns, and selecting those substrates on which insulator portions have all been formed. Since the refractive indices of oxides and metal differ, the presence of residual metal in the distribution patterns 103, namely electrical connection, can be determined by observing or imaging the panel after the anodic oxidation step, thereby making it possible to assess the acceptability of the panel. Etching or severing by laser irradiation of the gate electrode G and scan line SL is not necessary due to the insulator portion 103.

Figure 10:
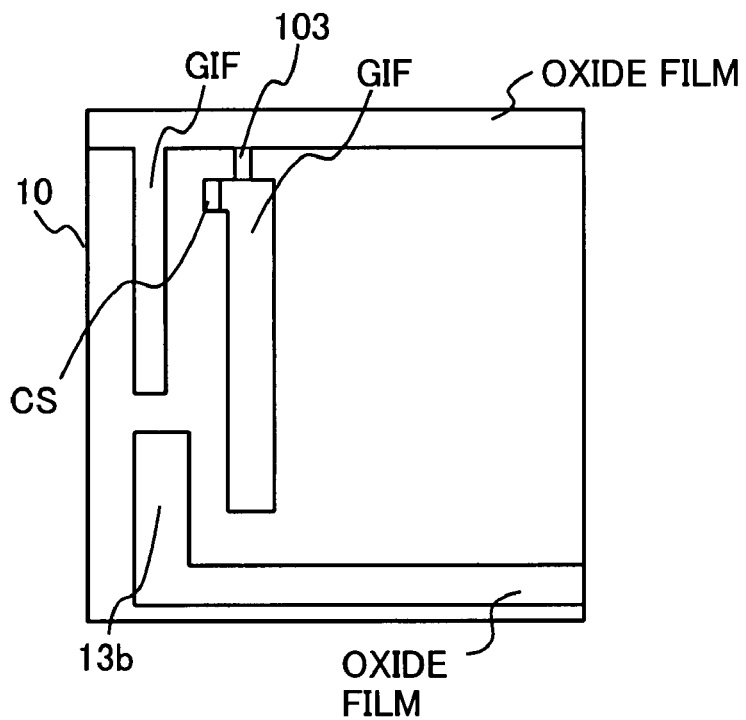
FIGS. 10 to 16 are partial overhead views each showing a substrate in an organic EL display panel production process of an embodiment according to the present invention respectively.

Post-treatment consists of removing the contact protective portion CP by washing followed by heat treatment to stabilize the oxide film. As shown in FIG. 10, on the surface of the substrate 10 following anodic oxidation treatment, the power supply line VccL, gate electrodes G and scan line SL, but not the contact portion CS where the metal portion is exposed, are covered with an oxide film, and the gate electrodes and capacitor electrode are respectively covered with oxide films in the form of gate insulating films GIF and dielectric layer 13b.

[Formation of Pixel Electrode]

Figure 11:
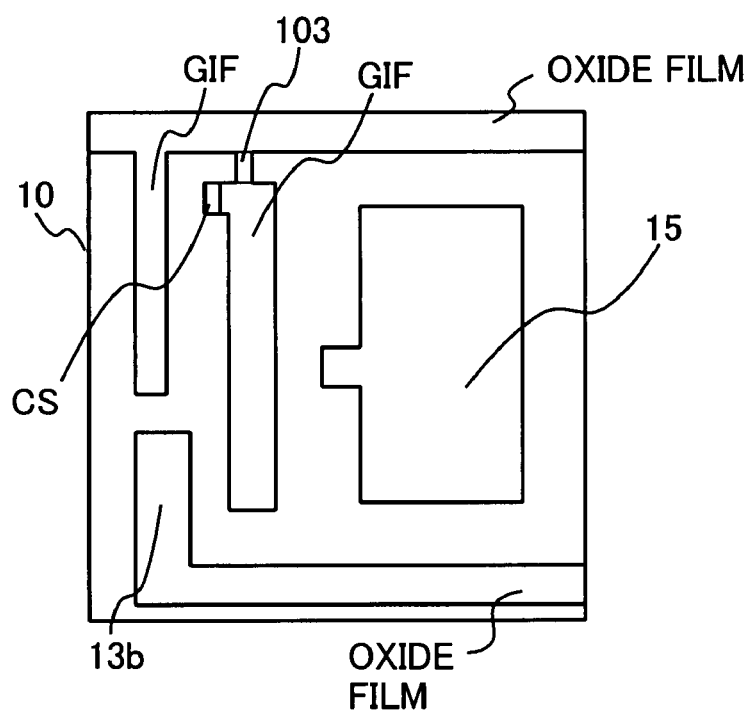

An electronic circuit component is formed on the surface of the substrate following anodic oxidation treatment. First, as shown in the overhead view of FIG. 11, a nearly rectangular pixel electrode 15 is formed in a predetermined pattern on the substrate to serve as an anode of the organic EL device.

In the case the pixel electrode 15 is required to transmit light, an extremely thin translucent film of a metal or metal alloy or a metal oxide and so on is typically used for the electrode material. For example, a translucent film of Au or Pd, indium tin oxide (ITO), indium zinc oxide (IZO), ZnO or SnO is also used. In the case the pixel electrode is not required to transmit light, a metal or metal alloy is typically used for the material. For example, Al, Ag, Cu, Au, Cr, and alloys or laminates containing these metals can be used.

[Formation of Source Electrode and Drain Electrodes]

Figure 12:
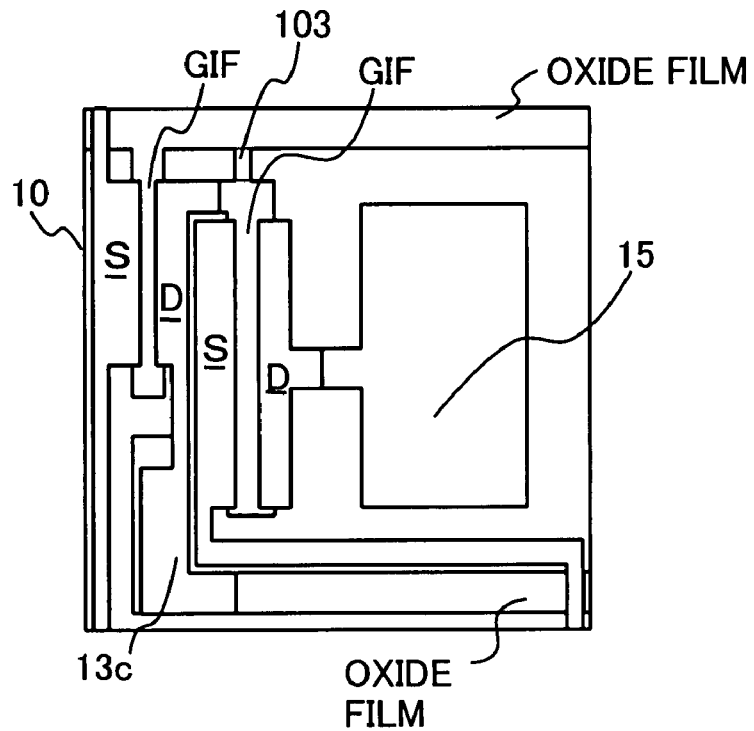

As shown in FIG. 12, wires to the data line DL and the power supply line are formed in a predetermined second conductor pattern on the pixel electrode 15 or a gate insulating film for both the source electrodes S and the drain electrodes D of the switching organic TFT device and the driving organic TFT device. The data line DL is formed so as to orthogonally intersect the scan line SL.

The drain electrode D of the driving organic TFT device is formed so as to be connected to the pixel electrode 15, while the source electrode S is formed so as to be connected to the power supply line VccL. The source electrode S of the switching organic TFT device is formed so as to be connected to the data line DL, while the drain electrode D is formed so as to be connected to the corresponding gate electrode of the driving organic TFT device via the contact portion CS.

The material of the source electrodes and drain electrodes is preferably that which allows a carrier to be efficiently injected into the organic semiconductor used while also having a low resistivity, an example of which is a bilayer structure consisting of Cr and Au. There are no particular limitations on the material of the source and drain electrodes, and metals such as Pt, Au, W, Ru, Ir, Al, Sc, Ti, V, Mn, Fe, Co, Ni, Zn, Ga, Y, Zr, Nb, Mo, Tc, Rh, Pd, Ag, Cd, Ln, Sn, Ta, Re, Os, Tl, Pb, La, Ce, Pr, Nd, Pm, Sm, Eu, Gd, Tb, Dy, Ho, Er, Tm, Yb or Lu, or laminates or compounds thereof may be used provided they have sufficient electrical conductivity. In addition, metal oxides such as ITO and IZO may also be used. Furthermore, the same material used for the source and drain electrodes can be used for the material of the data line DL and the power supply line VccL.

Although inferior to metals with respect to resistivity, organic electrically conductive materials and conjugated polymer compounds such as polyanilines, polythiophenes and polypyrroles can also be used for the source electrodes and drain electrodes. In this case, a low cost method such as printing can be used for pattern formation.

Furthermore, although the step for forming the pixel electrode 15 was carried out prior to the step for forming the source electrodes and drain electrodes in the present embodiment, these steps may also be carried out in the reverse order.

[Formation of Protective Insulating Film]

Figure 13:
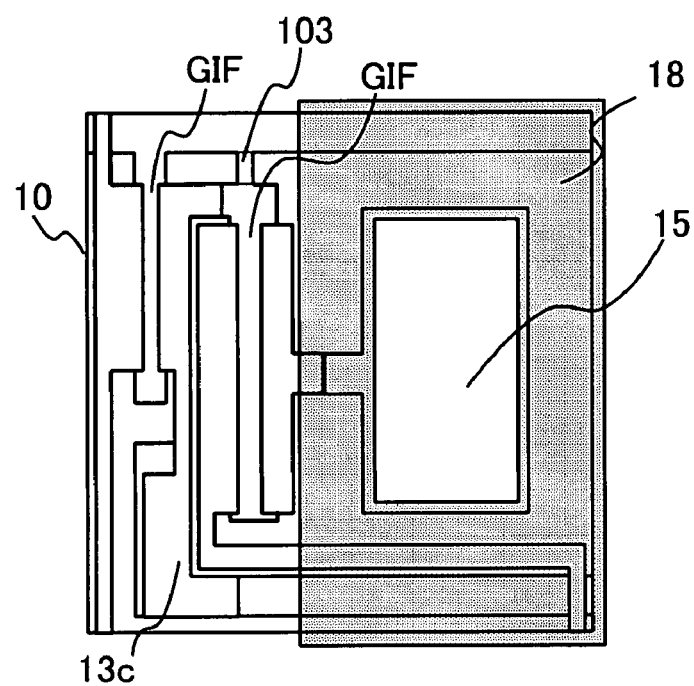

As shown in FIG. 13, a protective insulating film 18 is formed in a predetermined pattern that functions as a protective film of the edges of the pixel electrode and the edges of the organic semiconductor electrode. Namely, the protective insulating film 18 is formed in a pattern that exposes the pixel electrode 15 while covering the edges of the pixel electrode 15 of the organic EL device 14, and exposes the source and drain electrodes of the organic TFT devices as well as the gate insulating films.

An insulating polymer such as polyimide or a metal compound such as a metal oxide, metal nitride or metal fluoride, examples of which include $Al_2O_3$, $SiO_2$, SiN and SiON, can be used for the material of the protective insulating film.

[Formation of Organic Semiconductor Films]

Figure 14:
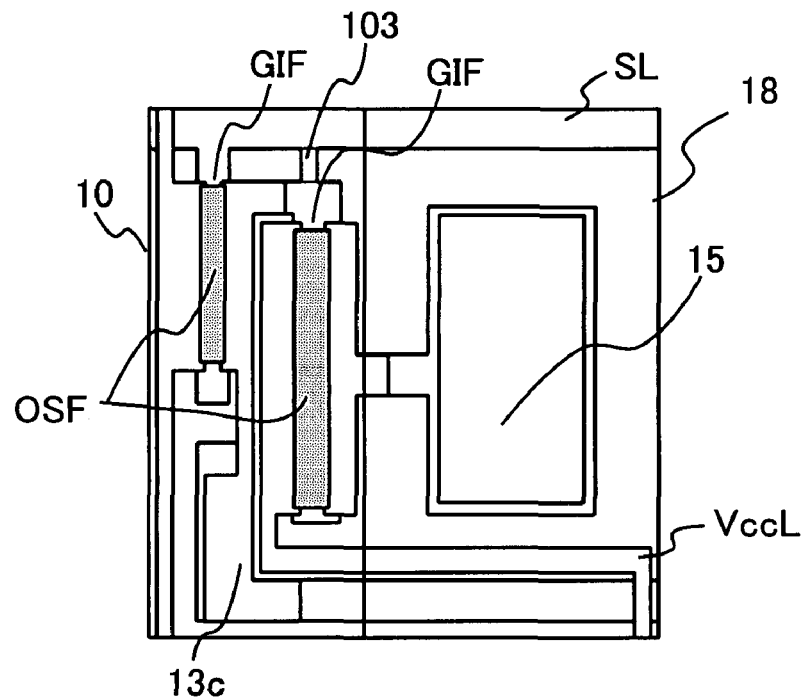

As shown in FIG. 14, organic semiconductor films OSF are respectively formed in a predetermined pattern by vapor deposition using a metal mask, for example, through the opening of the protective insulating film 18 so as to connect the exposed drain and source electrodes of the driving organic TFT device and the switching organic TFT device as well as the gate insulating films there between.

A material having a high carrier mobility is preferably used for the material of the organic semiconductor films OSF, and a low molecular weight organic semiconductor material or organic semiconductor polymer can be used.

Although pentacene can be used as an organic semiconductor, other materials may also be used provided they are organic materials that demonstrate semiconductor characteristics. Examples of low molecular weight materials include polycyclic quinone-based derivatives such as phthalocyanine-based derivatives, naphthalocyanine-based derivatives, azo compound-based derivatives, perylene-based derivatives, indigo-based derivatives, quinacridone-based derivatives and anthraquinone-based derivatives, cyanine-based derivatives, fullerene-based derivatives, or nitrogen-containing cyclic compound derivatives such as indole, carbazole, oxazole, inoxazole, thiazole, imidazole, pyrazole, oxadiazole, pyrazoline, thiathiazole and triazole, hydrazine derivatives, triphenylamine derivatives, triphenylmethane derivatives, stilbene derivatives, quinone compound derivatives such as anthraquinone diphenoxone, and polycyclic aromatic compound derivatives such as anthracene, pyrene, phenanthrene and coronene. Examples of polymer materials that can be used include those in which the structure of the above-mentioned low molecular weight compounds is that used in the main chain of a polymer such as a polyethylene chain, polysiloxane chain, polyether chain, polyester chain, polyamide chain or polyimide chain or that bound as a side chain in the form of a pendant, or aromatic conjugated polymers such as polyparaphenylene, aliphatic conjugated polymers such as polyacetylene, polythiophene-based heterocyclic conjugated polymers such as polyvinol and polythiophene, heteroatom-containing conjugated polymers such as polyanilines and polyphenylene sulfide, and carbon-based conjugated polymers such as compound conjugated polymers having a structure in which the structural units of conjugated polymers such as poly(phenylenevinylene), poly(anilenevinylene) or poly (thienylenevinylene) are alternately linked. In addition, polymers are also used that have alternately linked carbon-based conjugated structures and oligosilanes such as disilanylene carbon-based conjugated polymer structures in the manner of polysilanes and disilanylene arylene polymers, (disilanylene) ethenylene polymers and (disilanylene)ethynylene polymers. Other examples of polymers that may be used include polymer chains composed of inorganic elements such as phosphorous or nitrogen, polymers in which aromatic ligands are coordinated to a polymer chain such as phthalocyanate polysiloxane, polymers in which perylenes such as perylene tetracarboxylic acid have been condensed by heat treatment, ladder-type polymers obtained by heat treatment of a polyethylene derivative having a cyano group such as polyacrylonitrile, and compound materials in which an organic compound has been intercalated to a perovskite.

In addition, the surface of the gate insulating films between the source and drain electrodes can also be coated with a self-assembled unimolecular film. For example, the surface is preferably treated with hexamethyl disilazane (HMDS: $(CH_3)_3SiNHSi(CH_3)_3$). In addition, a composition may also be employed provided with a hydrophobic film by treatment with octadecyl trichlorosilane (OTS: $CH_3(CH_2)_{17}SiC_{13}$). In addition, an oriented film can also be separately provided on the gate insulating films.

The organic EL device is also not limited to the constitution of the present embodiment, but rather a constitution is also effective that uses, for example, a polymer organic EL material.

[Formation of Organic Material Layer]

Figure 15:
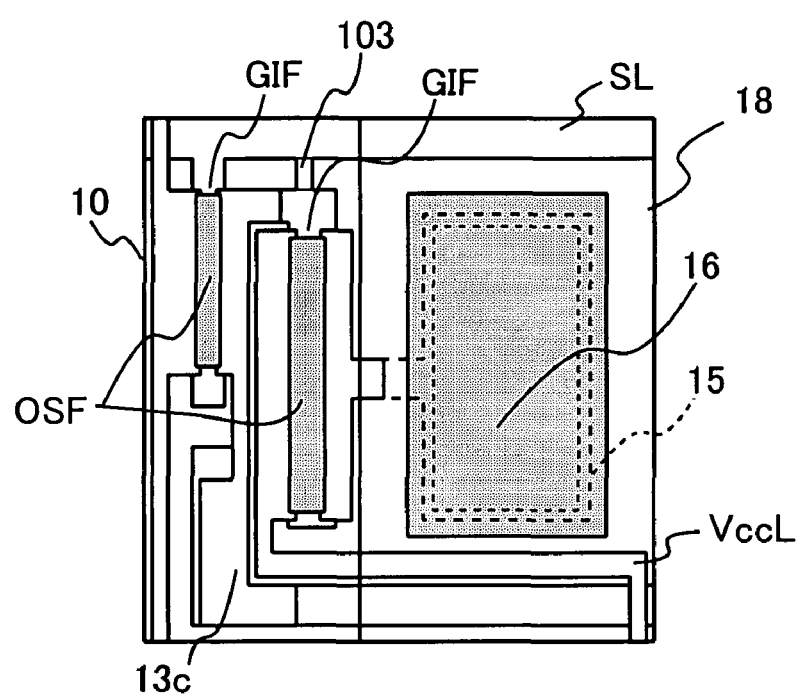

Next, as shown in FIG. 15, an organic material layer 16 containing at least an emission layer is formed on the exposed pixel electrode 15 by, for example, vapor deposition using a metal mask through the opening of the protective insulating film 18. The organic material layer 16 may also contain, for example, a hole injection layer, hole transport layer, electron transport layer and electron injection layer in addition to the emission layer.

[Formation of Common Electrode]

Figure 16:
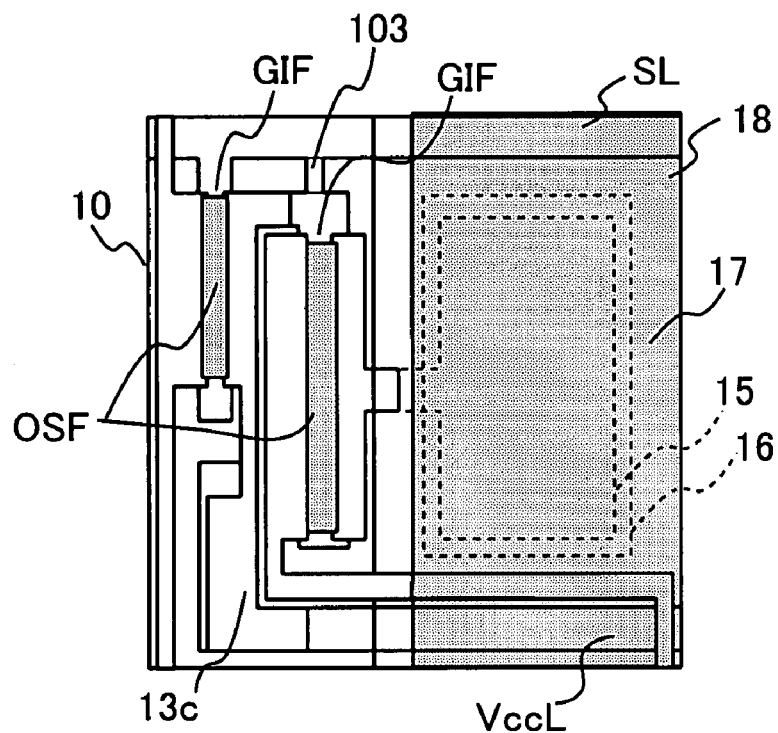

As shown in FIG. 16, a common electrode 17 serving as the anode of the organic EL device 14 is formed in a predetermined pattern by, for example, vapor deposition using a metal mask on the organic material layer 16. The common electrode 17 is also formed on the protective insulating film 18.

A metal or alloy is used for the material of the common electrode 17, examples of which include Al, Ag, Cu, Au, Cr and alloys thereof.

Formation of the common electrode is restricted to carrying out deposition at a temperature equal to or below the glass transition temperature of each organic material layer after forming the organic material layers so as to cause deterioration of any of the organic material layers deposited in the organic material layer formation step.

[Sealing]

The formed circuits and the organic EL device are sealed in a package in an inert state to as to cover the back surfaces thereof. In addition, they may also be sealed with an inorganic or polymer film. For example, the back of the organic EL device and so on may be sealed with an insulating sealing film such as an inorganic sealing film composed of a nitride such as silicon nitride, an oxide-nitride such as silicon oxide-nitride, an oxide such as silicon oxide or aluminum oxide, or a carbide such as silicon carbide, or may be sealed with multiple layers of polymers and inorganic films.

Moreover, although an active matrix display type of organic EL display panel has been explained in the present embodiment as described above, the present invention can also be applied to a substrate of a simple matrix display type of panel in which TFT devices and so on are arranged around a panel screen.

An organic EL panel employing active driving by organic TFT devices was fabricated followed by evaluation of the characteristics thereof. The composition of the materials of the organic EL display panel of the example is shown in Table 1.

TABLE 1

| Site | Material |
| --- | --- |
| Conductor patterns (scan lines, power supply lines, data lines) | Ta |
| Distribution patterns | Ta |
| (Capacitor Structure) | |
| Lower electrodes | Ta |
| Dielectric layer | $Ta_2O_5$ |
| Upper electrodes | Al |
| (Organic TFT Device Structure) | |
| Source/drain electrodes | Cr/Au |
| Gate electrodes | Ta |
| Gate insulating films | $Ta_2O_5$ |
| Organic semiconductor film | Pentacene |
| Self-assembled unimolecular film | Hexamethyl disilazane |
| (Organic EL Device Structure) | |
| Anode | IZO |
| Hole injection layer | CuPc |
| Hole transport layer | NPB |
| Emission layer | CBP (Ir(ppy)3-doped) |
| Hole blocking layer | BAlq |
| Electron transport layer | Alq3 |
| Electron injection layer | $Li_2O$ |
| Cathode | Al |
| Protective insulating film | Resist |

Ta films for the conductor and distribution patterns, gate electrodes and capacitor lower electrodes were deposited on a washed glass substrate followed by dry etching with an RIE apparatus to obtain a desired conductor pattern. At this time, the line width of the distribution pattern extending across the gate electrode of the driving transistor was narrower than the other lines, and deposited narrower so as to be insulated by the oxide film following anodic oxidation. More specifically, the line width was 150 nm.

As a result of carrying out anodic oxidation on the Ta conductor and distribution patterns, the Ta surface portion was covered with a $Ta_2O_5$ film, and gate insulating films and a capacitor dielectric layer composed of $Ta_2O_5$ were deposited. At this time, the portion of the distribution pattern having a line width of 150 nm was oxidized resulting in the formation of an insulator portion.

Subsequently, an IZO film was patterned to serve as an anode of the organic EL device.

Next, a bilayer film consisting of Cr and Au was patterned for the source and drain electrodes.

Subsequently, a protective insulating film in the form of a resist having a predetermined opening was patterned.

A hexamethyl disilane film was then provided on the gate insulating films by dip coating.

A desired opening was respectively provided and an organic material layer was respectively deposited with a vacuum deposition apparatus by using a metal mask for deposition of the organic semiconductor and organic EL device.

Finally, a glass package was affixed to the deposited surface of the substrate in a glove box filled with dry nitrogen gas N2.

An organic EL panel actively driven with organic TFT devices was fabricated under the conditions described above. Evaluation of the characteristics of the organic TFT devices confirmed that the two organic TFT devices operated normally and that the organic EL device was actively driven. The gate electrode of the driving transistor was able to be confirmed to have been completely isolated from the gate electrode of the switching transistor. The mobilities of the two first and second organic TFT devices were 0.18 cm$^2$/Vs and 0.16 cm$^2$/Vs, respectively, and the threshold voltage was −2.4 V to −2.1 V.

OTHER EMBODIMENTS

Figure 17A:
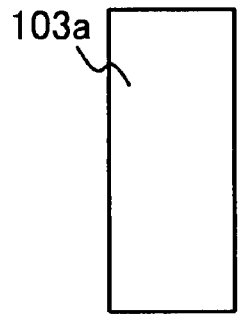
FIGS. 17A to 17C are partial overhead views each showing a distribution pattern on a substrate in an organic EL display panel production process of an embodiment according to the present invention respectively.
Figure 17B:
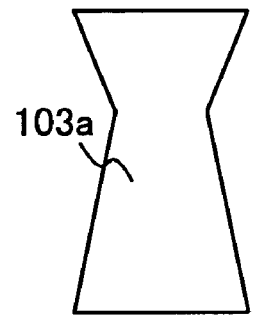
Figure 17C:
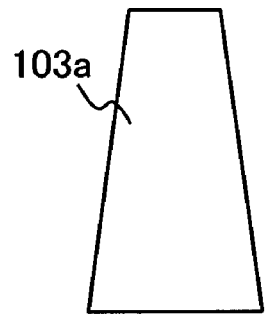

Although a distribution pattern 103a having a uniform width on the substrate as shown in FIG. 17A is used in the above-mentioned embodiment, distribution patterns 103a of various widths in which there is a constriction or taper in the wire pattern can also be employed as shown in FIG. 17B or FIG. 17C.

The following provides an explanation of a production process of a electronic circuit substrate provided with aluminum wiring as another embodiment of the present invention.

A tartaric acid and ethylene glycol electrolyte having a pH of 7.0±0.5, for example, is used for oxidation of an aluminum anode. The electrolyte, voltage, current and treatment time and so on are determined so as to form a fine oxide film for the insulating film and reduce porosity.

The film thickness for forming pores in the oxide film is controlled with the treatment time. When using the above method as well, the size of the pores can be controlled to a desired film thickness by controlling the electrolyte concentration, current density and so on. Furthermore, porosity is represented at the ratio of volume of the portion in which voids are formed by the pores to the total volume of the substrate surface layer, and is expressed as V1/V2 when the total pore volume is defined as V1 and the total volume of the oxide film, including the pores, is defined as V2.

Although an oxide coating is formed on aluminum when electrolysis is carried out in a specific solution using aluminum for the anode, a barrier oxide coating and a porous oxide coating can be formed due to differences in the type of electrolytic bath. A barrier coating can be formed when the aluminum is anodically oxidized in a neutral aqueous solution in the form of a mixed solution of boric acid and sodium borate (pH 5 to 7) or in an aqueous solution of ammonium tartrate, citric acid, maleic acid, glycolic acid and so on. Since the ability of these aqueous solutions to dissolve aluminum oxides is weak, a fine, thin oxide coating can be formed by anodic oxidation on the aluminum. The thickness of the barrier oxide coating is dependent on the voltage during anodic oxidation. Although a thick barrier coating is formed if anodic oxidation is carried out at a high voltage, since this causes insulation breakdown, a voltage of about 500 to 700 V is the limiting voltage. Here, a barrier coating is used preferably.

If the temperature of the electrolytic bath is low, the growth rate of the oxide coating is favorable and a hard oxide coating is formed. An oxide coating anodically oxidized in a sulfuric acid bath at about 0° C. can be used practically as a hard oxide coating. In the case of a high temperature of 60 to 75° C. for the electrolytic bath, the oxide coating becomes thin and soft resulting in a electrolytically polished surface.

FIG. 18 shows partial overhead views of conductor and distribution patterns 103a on an electronic circuit substrate 10 during anodic oxidation treatment in which a high potential pattern PH and a low potential pattern PL are connected with the constricted distribution pattern shown in FIG. 17B, and current is supplied from the high potential pattern PH to the low potential pattern PL. The conductor and distribution patterns on the substrate 10 have an oxide film converted on the surface thereof by anodic oxidation, and a laminated structure is formed comprising lower conductor and distribution patterns and an upper oxide film. The voltage, current, treatment time and so on of the electrolyte are set so that the oxide film (insulating film) is finely formed with low porosity.

Figure 18A:
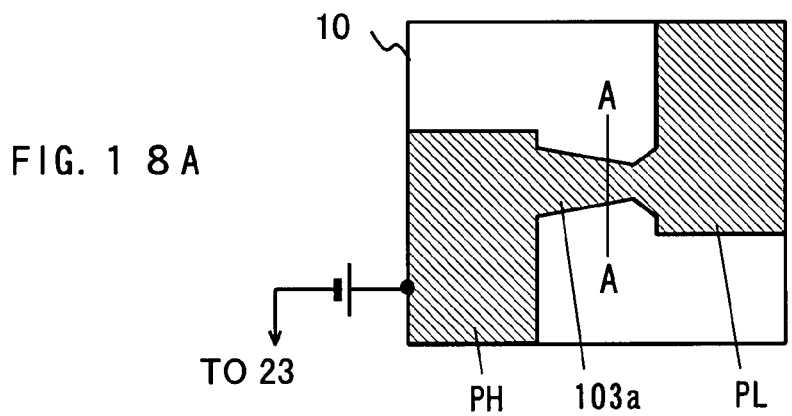
FIGS. 18A to 18D are partial overhead views each showing a conductor and distributor pattern on a substrate during anodic oxidation treatment in an electronic circuit substrate production process of another embodiment according to the present invention respectively.
Figure 18B:
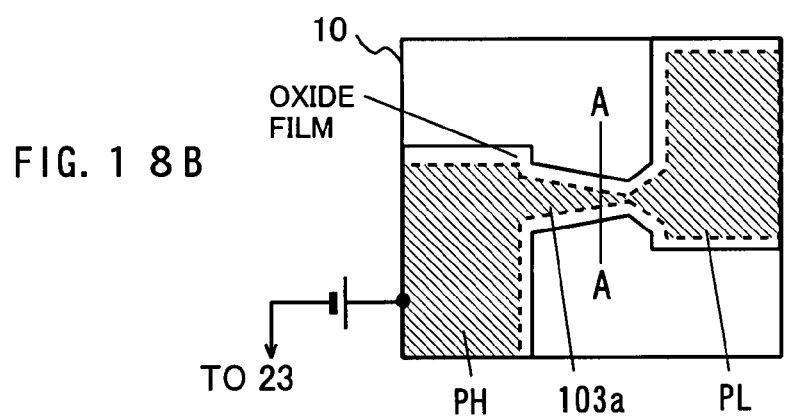
Figure 18C:
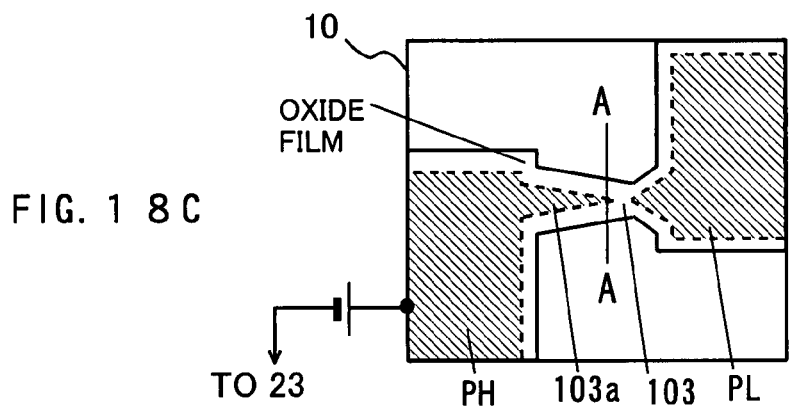
Figure 18D:
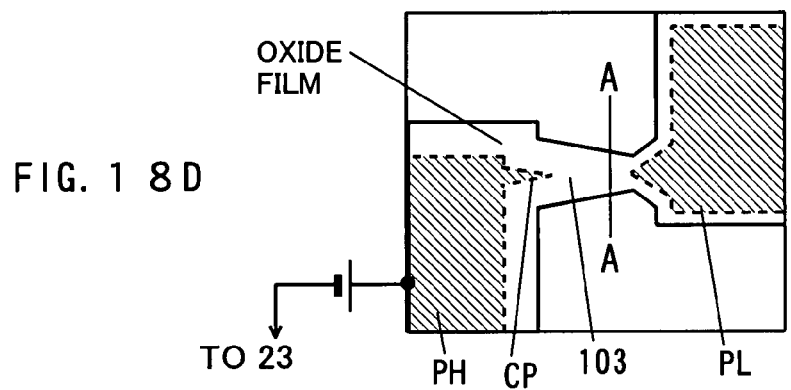
Figure 19A:
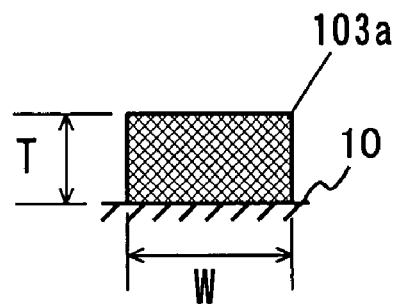
FIGS. 19A to 19D are cross-sectional views each showing a portion taken along line AA in each of FIGS. 18A to 18D respectively.
Figure 19B:
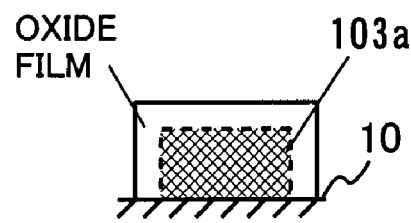
Figure 19C:
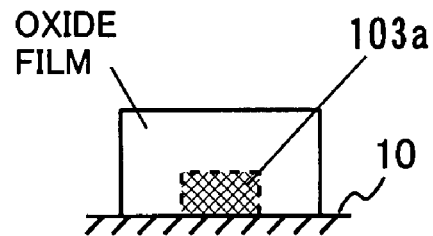
Figure 19D:
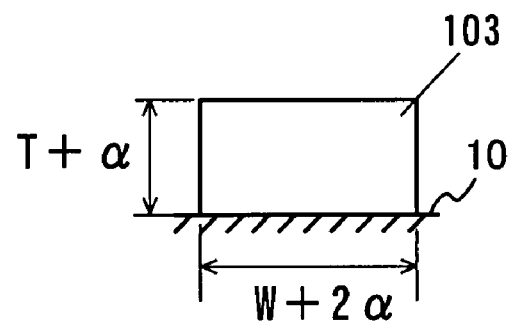

Here, as shown in FIG. 18A, although the conductor and distribution patterns are initially all metal, as shown in FIG. 18B, the width of the distribution pattern 103a becomes narrower with the passage of time since the width of the metal portion of the distribution pattern 103a becomes narrower as a result of the thickness of the oxide film formed on the side walls increasing. Moreover, as shown in FIG. 18C, the oxide film formed on one of the side walls of the constricted portion of the distribution pattern 103a integrates with the oxide film formed on the other side wall and the constricted portion is completely oxidized resulting in the formation of an insulator portion. As a result of the formation of an insulator portion that interrupts the conduction path as anodic oxidation progresses, as shown in FIG. 18D, together with the width and length of the metal portion of the distribution pattern 103a decreasing, the insulator portion extends toward the high potential pattern PH an increases in size. In this manner, if the width of the constricted portion of a portion of the distribution pattern 103a is set to be narrow, formation of the insulator portion 103 can be reliably achieved. As shown in FIG. 18, all exposed surfaces of the distribution pattern 103a that connects the high potential pattern PH and the low potential pattern PL are oxidized resulting in the formation of the insulator portion 103. Accordingly, an electronic circuit substrate is obtained comprising an anodically oxidizable conductor pattern formed on the substrate, an oxide film arranged on the conductor pattern formed from the conductor pattern by anodic oxidation, and an insulator portion 103 composed of the same material as the oxide film formed between the side walls of the conductor pattern.

FIGS. 19A to 19D are cross-sectional views of the distribution pattern 103a of FIGS. 18A to 18D. Since anodic oxidation is an oxidation reaction, the initial film thickness T and width W of each pattern increase to oxide film thickness T+a and width W+2a following treatment due to oxidation of the metal. This action observed in the direction of film thickness and the direction of width (side walls) is the result of progression of the oxidation reaction due to respective contact with the electrolyte solution. Accordingly, if conditions are preset such that the line width of the constricted portion of the distribution pattern 103 is roughly no more than twice the film thickness of the oxide film, namely such that 2(T+a)3 W+2a or 2 T3 W(∴a~ 0), then the formation of the insulator portion 103 can be reliably achieved.

In this manner, the width of the anodically oxidized distribution pattern is preferably at least partially set so that an insulator portion is formed in which the oxide film formed on one of the side walls of the distribution pattern becomes integrated with the oxide film formed on the other side wall. Moreover, in this embodiment, although the width of the distribution pattern is set so that the insulator portion is arranged biased toward the high potential side rather than low potential side of the positive potential of the distribution pattern while current is applied in the anodic oxidation step, the width of the distribution pattern is set so that the insulator portion is arranged biased toward one side between adjacent conductor patterns (FIG. 18C).

Moreover, FIG. 20 shows partial overhead views of conductor and distribution patterns on an electric circuit substrate 10 during anodic oxidation treatment in which a high potential pattern PH (wide width) and a low potential pattern PL (narrow width) are connected with a distribution pattern 103$a$ having a taper as shown in FIG. 17C, and current is supplied from the high potential pattern PH to the low potential pattern PL.

Figure 20A:
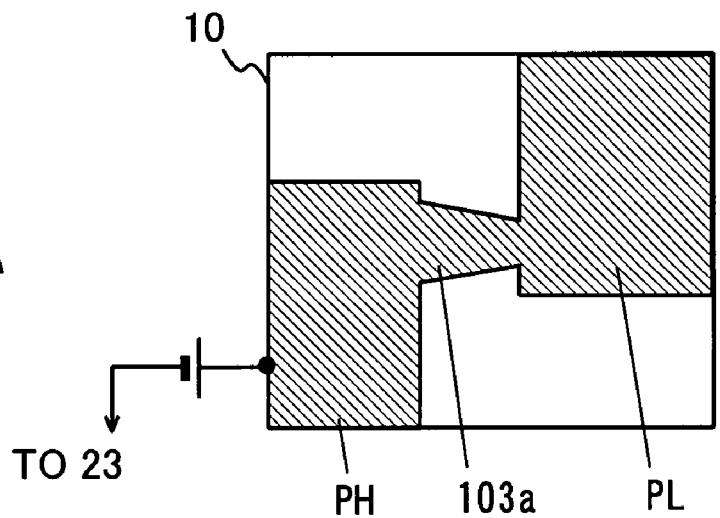
FIGS. 20A to 20C are partial overhead views each showing a conductor and distribution pattern on a substrate during an anodic oxidation treatment in an electronic circuit substrate production process of another embodiment according to the present invention respectively.
Figure 20B:
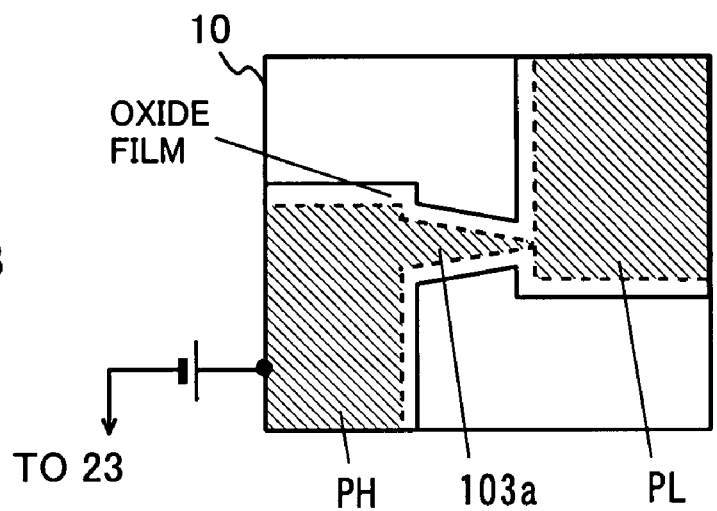
Figure 20C:
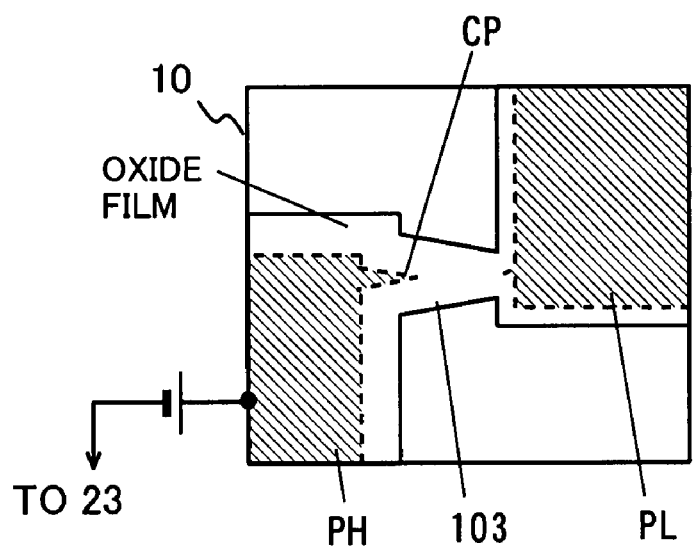

In this embodiment, although the conductor and distribution patterns are initially all metal as shown in FIG. 20A, as shown in FIG. 20B, the width of the distribution pattern 103$a$ becomes narrower with the passage of time since the width of the metal portion of the distribution pattern 103$a$ becomes narrower as a result of the thickness of the oxide film formed on the side walls increasing, and the oxide film formed from both side walls integrates into a single unit at the narrow low potential pattern PL resulting in the formation of an insulator portion. Moreover, as shown in FIG. 20C, as anodic oxidation progresses, together with the width and length of the metal portion of the distribution pattern 103$a$ decreasing, the insulator portion grows towards the high potential pattern PH and increases in size. In this manner, the formation of the insulator portion 103 can be reliably achieved by the taper of the distribution pattern 103$a$. As shown in FIG. 18, all exposed surfaces of the distribution pattern 103$a$ connecting the high potential pattern PH and the low potential pattern PL are oxidized resulting in the formation of the insulator portion 103.

Furthermore, since conductor protrusions (CP) (residual metal) are arranged on the side walls of the conductor pattern adjacent to the insulator portion 103 on the substrate 10 in each of the embodiments, these conductor projections CP can be used as a reference in a step for inspecting for the presence or absence of the insulator portion 103 to facilitate discrimination of the presence of residual metal of the distribution pattern 103, namely the presence or absence of an electrical connection, either visually or by imaging.

Figure 21A:
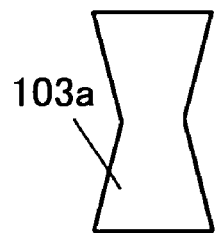
FIGS. 21A to 21D, FIGS. 22A to 22D and FIGS. 23A to 23D are partial overhead views each showing a distribution pattern on a substrate of another embodiment according to the present invention respectively.
Figure 21B:
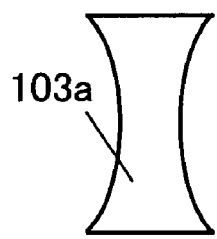
Figure 21C:
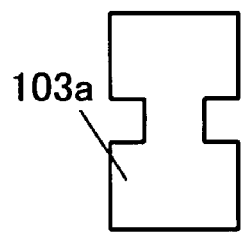
Figure 21D:
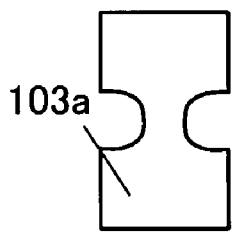

FIGS. 21A to 21D show other examples of constricted distribution patterns 103$a$. Constrictions can be formed so that the ends of linear or curved tapers, arranged symmetrically about a center line in the center between adjacent conductor patterns in the direction in which the conductor patterns are connected (vertical direction in the drawings) of a distribution pattern 103$a$, mutually join in the center (FIGS. 21A or 21B), or so as to be provided with rectangular or circular notches arranged symmetrically about the center line (FIGS. 21C or 21D).

Figure 22A:
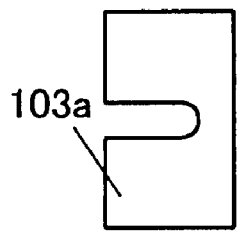
Figure 22B:
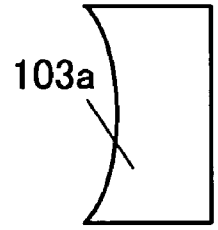
Figure 22C:
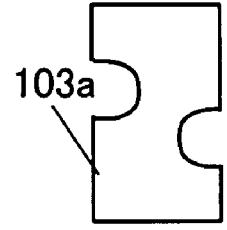
Figure 22D:
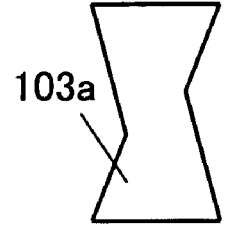
Figure 23A:
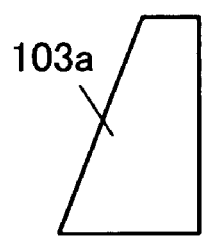
Figure 23B:
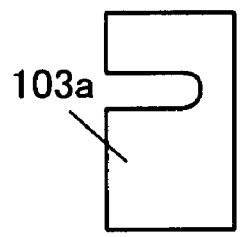
Figure 23C:
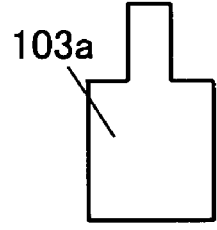
Figure 23D:
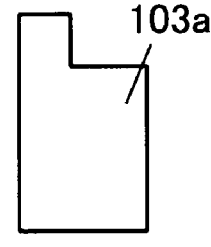

FIGS. 22A to 22D show still other examples of constricted distribution patterns 103$a$. Constrictions can be formed so that a notch, arranged in the center between adjacent conductor patterns in the direction in which the conductor patterns are connected (vertical direction in the drawings) of a distribution pattern 103$a$, is provided from the side of only one of the side walls (FIG. 22A), curved tapered ends are mutually joined in the center (FIG. 22B), circular notches are provided asymmetrically about the center line (FIG. 22C) or the ends of the tapers are made to be mutually different (FIG. 22D).

FIGS. 23A to 23D show still other examples of portions having a narrow width being biased toward one of the conductor patterns in a distribution pattern 103$a$ that connects conductor patterns. The distribution pattern 103$a$ can be formed so that a taper (FIG. 23A) or a notch (FIG. 23B) is provided from the side of only one of the side walls, or two rectangular notches arranged symmetrically about a center line (FIG. 23C) or a rectangular notch on the side of only one side wall (FIG. 23D), are provided at a connecting portion.

Figure 24A:
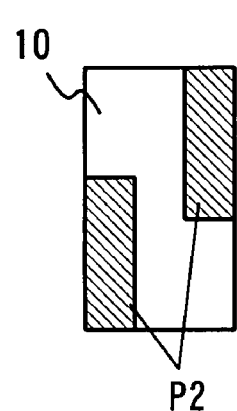
FIGS. 24A and 24B are partial overhead views each showing a conductor and distribution pattern on a substrate of another embodiment according to the present invention respectively.
Figure 24B:
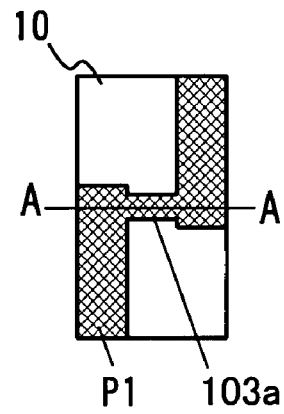

Moreover, although each of the embodiments has been explained using single layer patterns, a second conductor pattern P2 can be deposited in advance on the substrate 10 as shown in FIG. 24A, and a conductor and semiconductor pattern P1 containing a distribution pattern 103$a$ can be laminated thereon to form a laminate as shown in FIG. 24B. The conductor and distribution pattern P1 and the second conductor pattern P2 can also each be composed of multiple layers.

Figure 25A:
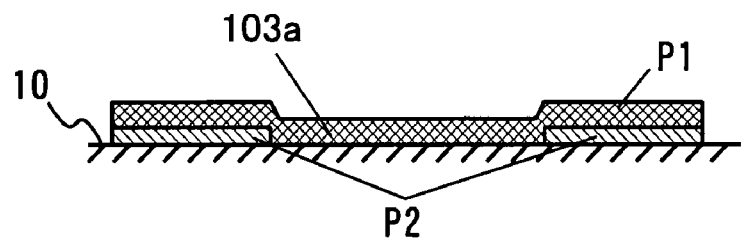
FIGS. 25A and 25B are cross-sectional views each showing a portion taken along line AA in each of FIGS. 24A and 24B respectively.
Figure 25B:
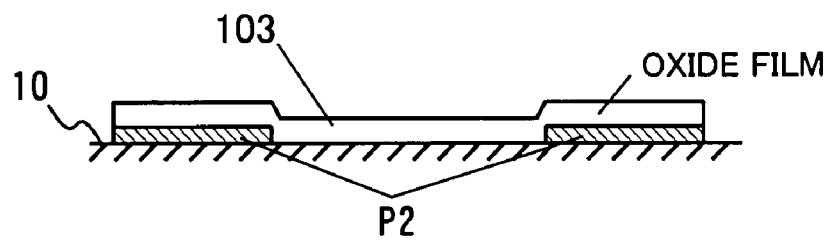

In the case a semiconductor and distribution pattern P1 and a second conductor pattern P2 are laminated as shown in FIG. 25A, if the conductor and distribution pattern P1 of the upper layer uses an anodically oxidizable material, the film thickness of an anodically oxidized distribution pattern can also be set so that the oxide films formed on both side walls of the distribution pattern and the upper surface are integrated to form an insulator portion in an anodic oxidation step as shown in FIG. 25B. The same materials or different materials can be respectively selected for the conductor and distribution pattern P1 and the second conductor pattern P2.

The invention claimed is:

1. A production process for making an electronic circuit substrate, comprising:
 a patterning step of forming a respectively anodically oxidizable conductor pattern and distribution pattern connected to said conductor pattern on a substrate; and
 an anodic oxidation step of contacting an electrolyte solution with said conductor pattern and said distribution pattern and carrying out anodic oxidation while applying current thereto, said patterns serving as anodes, to generate an oxide film from said conductor pattern and said distribution pattern so that the oxide film has a first width,
 wherein an insulator portion is formed, in the anodic oxidation step, so that the insulator portion has a second width for interrupting a conduction path of the distribution pattern by oxidizing said distribution pattern, and the second width of said insulator portion is larger but not more than twice the first width of said oxide film.

2. The production process for making an electronic circuit substrate according to claim 1, wherein the presence or absence of the insulator portion formed from the anodically oxidized distribution pattern connected to the conductor pattern is inspected, a substrate is selected in which the insulator portion is present, and an electronic component is formed on said substrate.

3. The production process for making an electronic circuit substrate according to claim 1, wherein a second conductor pattern is laminated onto the conductor pattern.

4. The production process for making an electronic circuit substrate according to claim 1, wherein the width of the distribution pattern is set to be uniform.

5. The production process for making an electronic circuit substrate according to claim 1, wherein the width of the distribution pattern is set to vary.

6. The production process for making an electronic circuit substrate according to claim 1, wherein the width of the distribution pattern is set so that the insulator portion is biased toward one of the conductor patterns, between which the insulator portion is arranged.

7. The production process for making an electronic circuit substrate according to claim 6, wherein the width of the distribution pattern is set so that the insulator portion is arranged to be biased toward a high potential side rather than a low potential side of positive potential of the distribution pattern when current is applied in the anodic oxidation step.

8. The production process for making an electronic circuit substrate according to claim 1, wherein the width of the distribution pattern is set so that an insulator portion is formed in which the oxide film formed on one of side walls of the distribution pattern is integrated with the oxide film formed on the other side wall in the anodic oxidation step.

9. The production process for making an electronic circuit substrate according to claim 1, wherein the electronic component is a thin film transistor, and the conductor pattern is a portion of electrodes of the thin film transistor.

10. The production process for making an electronic circuit substrate according to claim 1, wherein the electronic component is an organic electroluminescence device, and the conductor pattern is a portion of electrodes of the organic electroluminescence device.

11. An electronic circuit substrate comprising:
an anodically oxidizable conductor pattern formed on a substrate; an oxide film having a first width arranged on said conductor pattern generated from said conductor pattern by anodic oxidation; and an insulator portion having a second width formed between side walls of said conductor patterns, wherein the insulator portion is formed of the same material as the oxide film, and
wherein the second width of said insulator portion is larger but not more than twice the first width said oxide film.

12. The electronic circuit substrate according to claim 11, wherein a second conductor pattern is laminated on the conductor pattern.

13. The electronic circuit substrate according to claim 11, wherein the width of the insulator portion is set to be uniform.

14. The electronic circuit substrate according to claim 11, wherein the width of the insulator portion is set to vary.

15. The electronic circuit substrate according to claim 11, wherein the insulator portion is arranged to be biased toward one of the conductor patterns between adjacent conductor patterns.

16. The electronic circuit substrate according to claim 11, wherein conductor protrusions are arranged on a substrate side of side walls of the conductor pattern adjacent to the insulator portion.

17. The electronic circuit substrate according to claim 11, wherein the conductor pattern is formed of a metal of Ta, Al, Mg, Ti, Nb or Zr, or an alloy or laminate thereof.

18. The electronic circuit substrate according to claim 11, wherein the conductor pattern is a portion of electrodes of a thin film transistor.

19. The electronic circuit substrate according to claim 11, wherein the conductor pattern is a portion of electrodes of an organic electroluminescence device.

* * * * *